United States Patent
Beroz et al.

(10) Patent No.: US 7,268,304 B2
(45) Date of Patent: Sep. 11, 2007

(54) MICROELECTRONIC CONNECTION COMPONENTS HAVING BONDABLE WIRES

(75) Inventors: Masud Beroz, Livermore, CA (US); Jae M. Park, San Jose, CA (US); Belgacem Haba, Cupertino, CA (US); Fion Tan, San Jose, CA (US); Philip R. Osborn, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 89 days.

(21) Appl. No.: 11/111,145

(22) Filed: Apr. 21, 2005

(65) Prior Publication Data
US 2005/0243529 A1 Nov. 3, 2005

Related U.S. Application Data

(60) Provisional application No. 60/564,187, filed on Apr. 21, 2004.

(51) Int. Cl.
H01R 43/00 (2006.01)
H01R 12/04 (2006.01)
H05K 13/00 (2006.01)
H05K 1/11 (2006.01)

(52) U.S. Cl. ............... 174/261; 257/784; 257/734; 29/854; 29/857; 29/860

(58) Field of Classification Search ........ 257/734–736, 257/670, 671, 784; 174/261; 29/832, 842, 29/854, 857, 860
See application file for complete search history.

(56) References Cited

U.S. PATENT DOCUMENTS

| | | | |
|---|---|---|---|
| 5,446,245 A * | 8/1995 | Iwayama et al. | 174/261 |
| 5,489,749 A | 2/1996 | DiStefano et al. | |
| 5,719,435 A * | 2/1998 | Davis et al. | 257/666 |
| 5,977,618 A * | 11/1999 | DiStefano et al. | 257/674 |
| 6,229,100 B1 * | 5/2001 | Fjelstad | 174/261 |
| 6,307,253 B1 * | 10/2001 | Yamamoto et al. | 257/666 |
| 2005/0083153 A1 * | 4/2005 | Qin et al. | 333/247 |

* cited by examiner

*Primary Examiner*—Jeremy C. Norris
(74) *Attorney, Agent, or Firm*—Lerner, David, Littenberg, Krumholz & Mentlik, LLP (57) ABSTRACT

A connection component for a semiconductor chip includes a substrate having a gap over which extends a plurality of parallel spaced apart leads. The ends of the leads are adhered to the substrate either by being bonded to contacts or being embedded in the substrate. The connection component can be formed, in one embodiment, by stitch bonding wire leads across the gap. In another embodiment, a prefabricated lead assembly supporting spaced apart parallel leads is juxtaposed and transferred to the substrate. The connection component is juxtaposed overlying a semiconductor chip whereby leads extending over the gap may have one end detached and bonded to an underlying chip contact.

9 Claims, 7 Drawing Sheets

MICROELECTRONIC CONNECTION COMPONENTS HAVING BONDABLE WIRES

CROSS REFERENCE TO RELATED APPLICATIONS

This application claims the benefit of the filing date of U.S. Provisional Patent Application No. 60/564,187 filed Apr. 21, 2004, the disclosure of which is hereby incorporated herein by reference.

BACKGROUND OF THE INVENTION

Semiconductor chips typically are connected to external circuitry through contacts on a surface of the chip. The contacts on the chip typically are disposed in regular patterns such as a grid substantially covering the front surface of the chip, commonly referred to as an "area array" or in elongated rows extending parallel to and adjacent each edge of the chip front surface. Each contact on the chip must be connected to external circuitry, such as the circuitry of a supporting substrate or circuit panel. Various processes for making these interconnections use prefabricated arrays of leads or discrete wires. For example, in a wire bonding process, the chip is physically mounted on the substrate. A fine wire is fed through a bonding tool. The tool is brought into engagement with the contact on the chip so as to bond the wire to the contact. The tool is then moved to a connection point of the circuit on the substrate, so that a small piece of wire is dispensed and formed into a lead, and connected to the substrate. This process is repeated for every contact on the chip.

In the so-called tape automated bonding process, a dielectric supporting tape, such as a thin foil of polyimide is provided with a hole slightly larger than the chip. An array of metallic leads is provided on one surface of the dielectric film. These leads extend inwardly from around the hole towards the edges of the hole. Each lead has an innermost end projecting inwardly, beyond the edge of the hole. The innermost ends of the leads are arranged side by side at spacings corresponding to the spacings of the contacts on the chip. The dielectric film is juxtaposed with the chip so that hole is aligned with the chip and so that the innermost ends of the leads will extend over the front or contact-bearing surface on the chip. The innermost ends of the leads are then bonded to the contacts of the chip, as by ultrasonic or thermocompression bonding. The outer ends of the leads are connected to external circuitry.

The rapid evolution of the semiconductor art has created continued demand for incorporation of progressively greater numbers of contacts and leads in a given amount of space. U.S. Pat. No. 5,489,749 discloses improvements in semiconductor chip connection components which include a plurality of electrically conductive leads and may also include a support structure such as a flexible, dielectric film with a compliant, typically elastomeric underlayer disposed beneath the flexible film. Each such lead desirably is connected to a terminal disposed on the surface of the support structure. A connection section of each lead extends across a gap in the support structure. A first end of each connection section, connected to one of the terminals, is permanently attached to the support structure, whereas the opposite, second end of the connection section is releasably attached to the support structure. For example, the second end of each connection section may be connected through a frangible section connecting the second end to a bus structure anchored on the support structure.

Certain preferred connection components disclosed in the patent have numerous elongated leads disposed side-by-side with the connection sections of the various leads extending across a common gap in the form of a slot in the support structure. In certain disclosed processes, the connection component is juxtaposed with the chip so that the support structure, and preferably a compliant layer thereof, overlies the contact-bearing surface of the chip and so that the gap or slot in the support structure is aligned with a row of contacts on the chip. This process serves to align each connection section with a contact on the chip. After placement of the connection component on the chip, each lead is engaged by a bonding tool. The bonding tool moves downwardly, towards the surface of the chip. As the bonding tool moves downwardly, it disengages the second end of each lead connection section from the support structure, as by breaking the frangible section of the lead, and moves the connection section downwardly into engagement with the chip contact. At the same time, guide surfaces on the bottom of the bonding tool engage the connection section and guide it into more precise alignment with the associated contact. The bonding tool then bonds the connection section to the contact.

The end-supported lead bonding processes according to preferred aspects of the patent offer numerous advantages. Because each lead is supported at both ends prior to bonding, it can be maintained in position until it is captured by the bonding tool. The bonding tool will reliably capture the correct lead, and hence there is little chance that an incorrect lead will be bonded to a contact. The process can be performed at reasonable cost. Moreover, the products resulting from preferred processes according to the patent, allow free movement of the terminals on the support structure relative to the chip after connection, both in the X and Y directions, parallel to the chip surface, and in the Z or compliance direction perpendicular to the chip surface. Thus, the assembly can be readily tested by engaging a multiple probe test fixture with the terminals. When the terminals on the support structure are bonded to contact pads of a substrate, as by solder bonding or other processes, the assembly can compensate for differential thermal expansion between the chip and the substrate, as by flexing of the leads and deformation of the flexible support structure.

However, manufacture of the preferred connection components for use in these processes has heretofore required precise control of photoforming processes. The leads utilized in certain end-supported lead bonding processes have incorporated connection sections of substantially uniform widths and frangible sections having widths less than the width of the connection section. For example, the frangible section may be defined by a pair of V-shaped notches extending inwardly towards one another in the widthwise direction from laterally opposite edges of the connection section. The width between the points of the V is substantially less than the width of the remaining portion of the connection section. Although this arrangement provides useful frangible sections, it imposes stringent requirements on the photoforming process. The process must be capable of forming feature sizes as small as the smallest width within the frangible section. Stated another way, the photoforming process must be more precise than required to form the connection sections themselves.

There has, accordingly, been a desire heretofore for improved methods of making connection components useful in end-supported lead bonding and for improved connection components. In particular, there has been a desire for processes which mitigate the requirement for precise photoforming steps in fabrication of such connection components.

SUMMARY OF THE INVENTION

In one embodiment of the present invention, there is described a prefabricated lead assembly comprising a plurality of elongated leads having a longitudinal axis, each of the leads having first and second ends, the leads arranged in spaced apart juxtaposed position with the longitudinal axes of the leads arranged in parallel relationship, and a support maintaining the leads in parallel spaced apart relationship.

In a further embodiment of the present invention, there is described a method of attaching at least one lead between one of a plurality of first contacts on a portion of a first substrate and a second portion of the substrate, the plurality of first contacts spaced from the second portion of the substrate by a gap, the method comprising positioning a lead assembly proximate the gap, the lead assembly comprising a plurality of elongated leads having a longitudinal axis, each of the leads having first and second ends, the leads arranged in spaced apart juxtaposed position with the longitudinal axes of the leads arranged in parallel relationship, and a support maintaining the parallel spaced apart relationship of the leads; detaching at least one of the leads from the assembly forming a detached lead; and attaching the first end of the detached lead to one of the first contacts; and securing the second end of the detached lead to the second portion of the substrate.

In a further embodiment of the present invention, there is described a method of attaching a plurality of leads to a plurality of chip contacts of a semiconductor chip, the method comprising providing a substrate including a gap having spaced apart edges and a plurality of first contacts adjacent one edge of the gap; positioning a lead assembly proximate the gap, the lead assembly including a plurality of elongated leads having a longitudinal axis, each of the leads having first and second ends, the leads arranged in spaced apart juxtaposed position with the longitudinal axes of the leads arranged in parallel relationship, and a support maintaining the parallel spaced apart relationship of the leads; detaching a plurality of the leads from the assembly at the first and second ends thereof to form a plurality of detached leads; attaching the first ends of the detached leads to the plurality of first contacts; securing the second ends of the detached leads to the substrate adjacent another edge of the gap to form a plurality of attached leads; positioning the plurality of chip contacts of the semiconductor chip exposed within the gap underlying the substrate; and bonding a portion of each of plurality of attached leads to one of the chip contacts.

In a further embodiment of the present invention, there is described a method of making a connection component for a semiconductor chip, the method comprising providing a substrate having a gap defined between spaced apart first and second edges, providing a plurality of first contacts on the substrate adjacent the first edge of the gap, and stitching a wire lead across the gap, one end of the lead bonded to one of the first contacts and the other end of the lead secured to the substrate adjacent the second edge of the gap.

In a further embodiment of the present invention, there is described a connection component for a semiconductor chip, the connection component comprising a substrate having a gap defined between spaced apart first and second edges, a plurality of first contacts on the substrate adjacent the first edge of the gap, a wire lead stitched across the gap having one end bonded to the first contact and another end secured to the substrate adjacent the second edge of the gap.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION OF THE PREFERRED EMBODIMENTS

In describing the preferred embodiments of the invention illustrated in the drawings, specific terminology will be used for the sake of clarity. However, the invention is not intended to be limited to the specific terms so selected, and it is to be understood that each specific term includes all technical equivalents that operate in a similar manner to accomplish a similar purpose.

Figure 1:
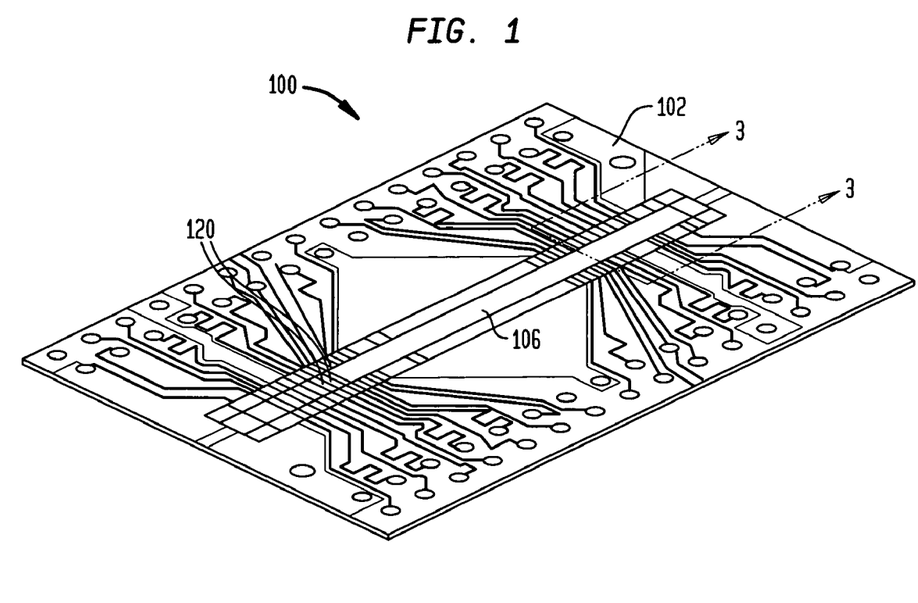
FIG. 1 is a perspective view of a tape substrate having bond wires stitched across a bond window exposing therein the underlying semiconductor chip contacts.

Referring now to the drawings, wherein like reference numerals represent like elements, there is shown in FIG. 1 a semiconductor connection component generally designated by reference numeral 100. A portion of the connection component 100 is shown enlarged in FIG. 2 for clarification of the detailed description of the present invention as to follow. The connection component 100 includes a substrate 102 having a generally planar top surface 104. The substrate 102 is in the nature of a continuous flexible tape of sheet-like dielectric material such as commonly used in the so-called tape automated bonding process, e.g., polyimide material. The substrate 102 includes at least one elongated gap 106 having spaced apart edges 108, 110. The substrate 102 may be formed as a continuous elongated tape having a plurality of spaced apart gaps 106 to be aligned with semiconductor chip contacts for use in connecting the semiconductor chips thereto as is known from the aforementioned tape automated bonding process.

Figure 2:
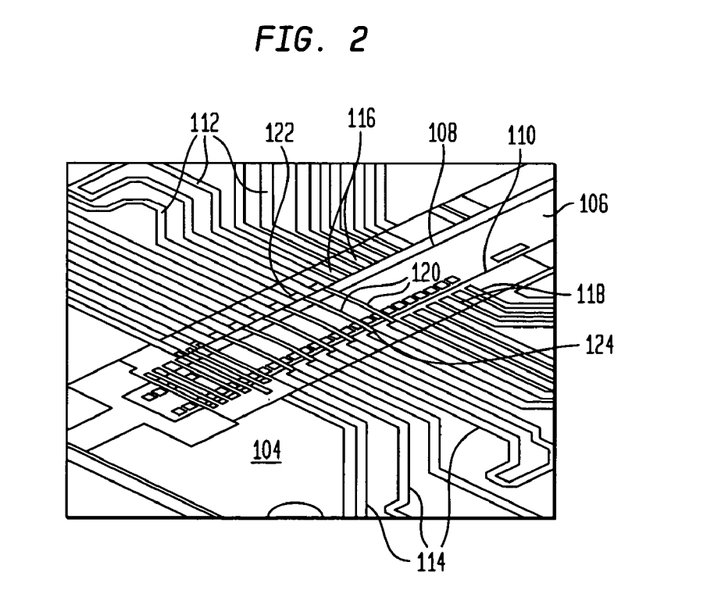
FIG. 2 is a enlarged perspective view of a portion of the bond window as shown in FIG. 1.

The substrate 102 may include a plurality of circuit traces 112, 114 or common bus provided on the top surface 104 on either side of the gap 106. A plurality of spaced apart first contacts 116 are provided on the top surface 104 of the substrate 102 adjacent one of the edges 108, 110 of the gap 106. Each of the contacts 116 are in electrical continuity to one or more of the circuit traces 112, 114. Optionally, a plurality of second contacts 118 or common bus are provided on the top surface 104 of the substrate 102 adjacent the other edge 108, 112 of the gap 106. Likewise, the second contacts 118 may be in electrical continuity with one or more of the circuit traces 112, 114. Extending across the gap 106 are a plurality of spaced apart elongated wire leads 120 which are stitch bonded as to be described in further detail hereinafter. The wire leads 120 are arranged generally with their longitudinal axes parallel to one another, and transverse to the longitudinal axis of the gap 106. The wire leads 120 have a first end 122 stitch bonded to one of the first contacts 116. The second end 124 of the wire leads 120 are secured to the substrate 102 adjacent edge 110 of the gap 106 by either imbedding the second end into the substrate or stitch bonding to one of the second contacts 118.

As is known in the art, a ball bonding or stitch bonding process uses a wire bonder wherein a fine wire is fed through a bonding tool. The tool is brought into engagement with a contact so as to bond the wire to the contact. The tool is then removed to a connection point of another portion of the circuit on the substrate, so that a small piece of wire is dispensed and formed into a wire lead, and connected to the connection point of the circuit. Bonding equipment and tools for ball/stitch bonding in forming wire leads is well known in the semiconductor connection art and are therefore not further described.

Figure 3:
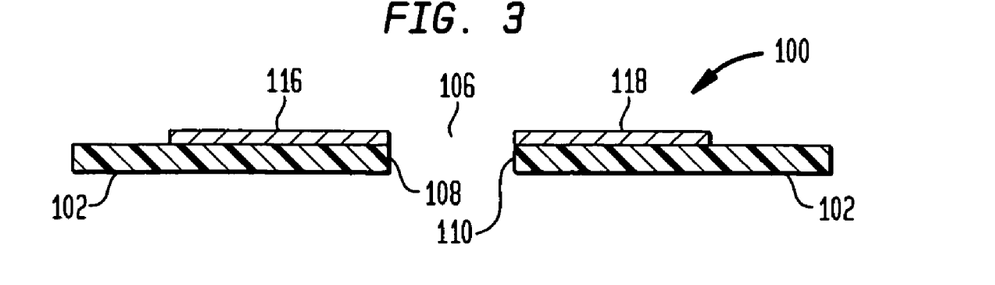
FIG. 3 is a cross-sectional view of the tape substrate as shown in FIG. 1 taken along line 3-3.
Figure 4:
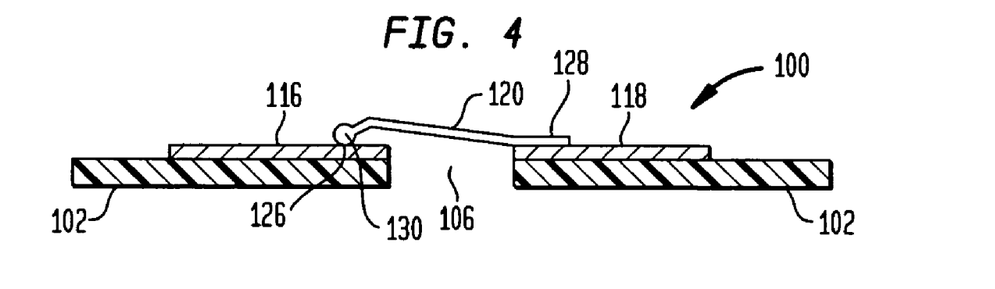
FIG. 4 is a cross-sectional view showing an embodiment of a stitch wire bond extending across the bond window in accordance with one embodiment of the present invention.

Referring to FIGS. 3 and 4, a connection component 100 is shown with spaced apart first and second contacts 116, 118 on either side of gap 106 formed in the substrate 102. Using a ball/stitch bonder, a fine wire is ball bonded at its free end to contact 116 forming a ball bond 126 thereat. The wire is extended across the gap 106 and stitch bonded via a stitch bond 128 to one of the second contacts 118 forming a wire lead 120. As used herein, the terms "stitch bonding" or "stitch bond" will be broadly used to identify the forming of a wire bond with or without the formation of a ball 130 at the juncture between the end of the wire lead and the contact. Thus, "stitch bond" or "stitch bonding" will embrace both of the ball bond 126 formed with ball 130 as well as the stitch bond 128 formed without a ball.

Figure 5:
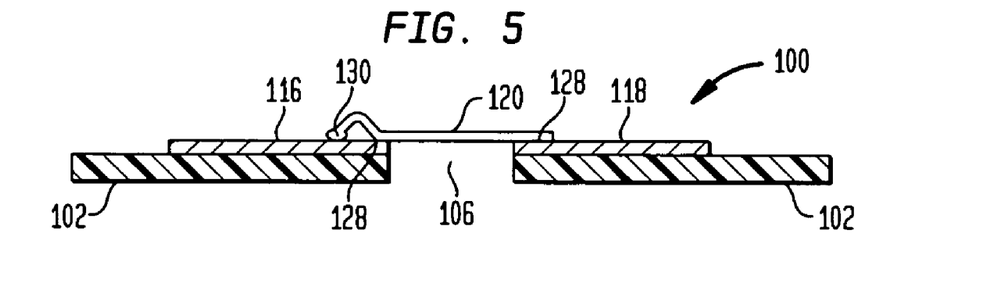
FIGS. 5, 6, 7, 8 and 9 are cross-sectional views of a stitch wire bond extending across the bond window in accordance with other embodiment of the present invention.
Figure 6:
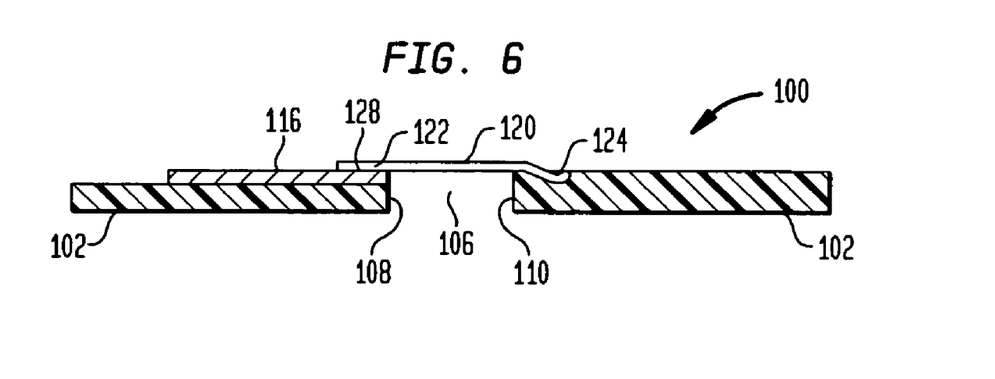

In the embodiment shown in FIG. 5, the wire lead 120 is formed having a ball bond 126 and an adjacent stitch bond 128 on contact 116, and a stitch bond 128 on contact 118. It is contemplated that a stitch bond provides a weaker connection to a contact than a ball bond. Accordingly, the wire leads 120 will generally have a severable connection to one of the contacts 116, 118 at the stitch bond 128. The severability of the wire leads 120 allows for connection of the leads to underlying chip contacts as to be described hereinafter. The severabilty of one end of the wire lead 120 can also be accommodated by the embodiment disclosed in FIG. 6. As shown, the wire lead 120 has its first end 122 stitch bonded to contact 116. The second end 124 of the wire lead 120 is embedded using the bonding/stitching tool into a portion of the substrate 102 adjacent edge 110 of the gap 106. By embedding the second end 124 into the substrate 102, a temporary connection is formed with the wire lead 120. During latter connection of the wire lead 120 to an underlying chip contact, the second end 124 is released from the substrate 102 to enable bonding to an underlying chip contact. As such, the embedded end forms a severable portion in a manner somewhat similar to a stitch bonded end as previously described.

Figure 7:
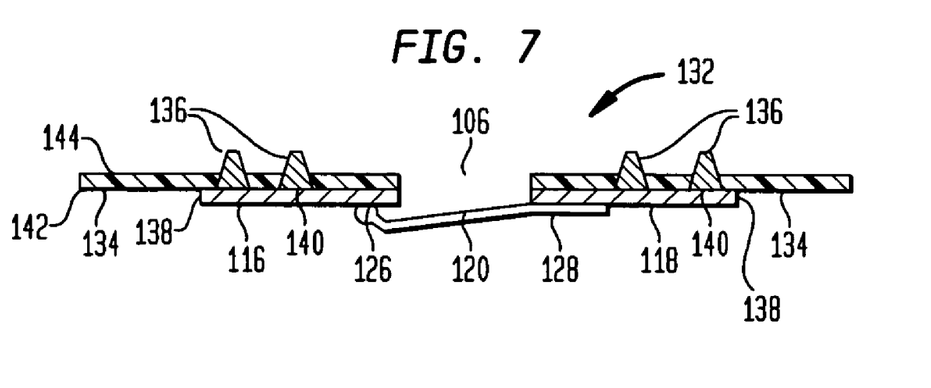
Figure 8:
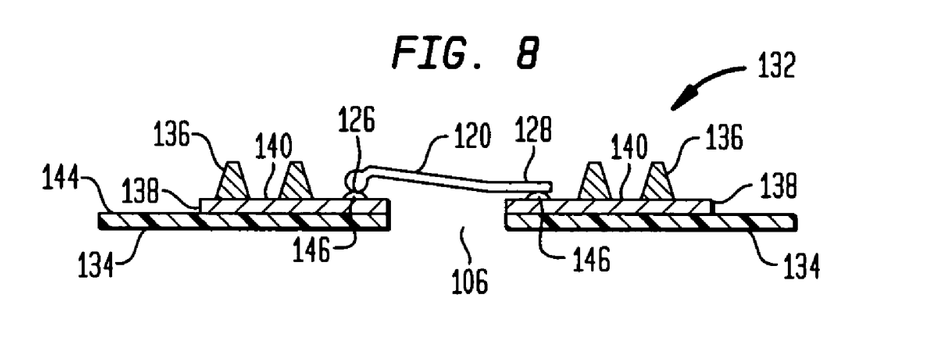
Figure 9:
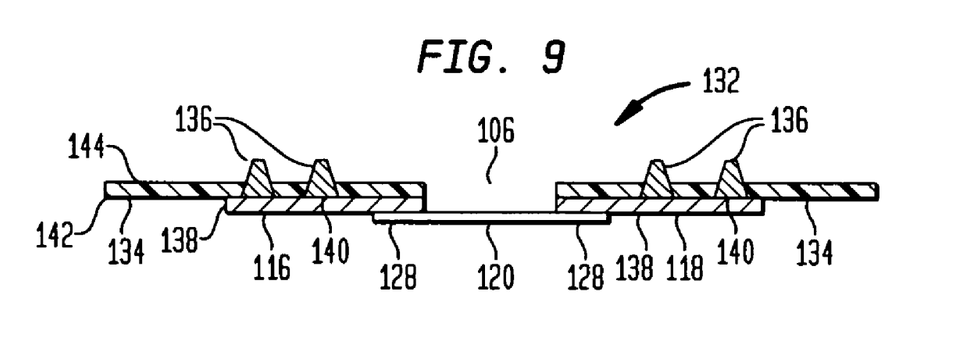

Referring to FIGS. 7-9, there is shown another semiconductor connection component generally designated by reference numeral 132 illustrating circuits in structures. By way of example, the connection component 132 includes a dielectric substrate 134 such as of polyimide material having a gap 106 therein. At least one conductive stud or nubbin 136 is formed projecting upwardly from the surface of a conductive circuit trace 138 or contact having a planar exposed surface 138 arranged adjacent gap 106. The nubbins 136 and conductive circuit traces 138 may be formed from copper or other electrically conductive materials using processed well known in the semiconductor processing art.

In the embodiment shown in FIG. 7, the nubbins 136 extend upwardly through the substrate 134, while the conductive circuit traces 138 or contacts are positioned overlying the bottom surface 142 of the substrate. The individual wire leads 120 are attached to one of the circuit traces 138 adjacent gap 106 by a ball bond 126, the other end being formed with a stitch bond 128 to the circuit trace adjacent the other side of the gap. In the embodiment shown in FIG. 9, the wire leads 120 are formed with stitch bonds 128 at either end to the conductive traces 138. In the embodiment shown in FIG. 8, the circuit traces 138 are disposed on the upper surface 144 of the substrate 134. The wire leads 120 may be attached between the spaced apart circuit traces 138 or contacts via a ball bond 126 or stitch bond 128 connection. In addition, the circuit traces 138 may be provided with bonding pads 146 to which the ends of the wire leads 120 are attached. The bonding pads 146 may be formed from a variety of materials, including bonding material and the like. From the foregoing descriptions of the connection components 100, 132, it should be apparent that the present invention of including wire leads 120 which are ball bonded/stitch bonded overlying a gap in a substrate may be employed in a variety of applications and arrangements of contacts and circuit traces for connection to a semiconductor chip.

Figure 10:
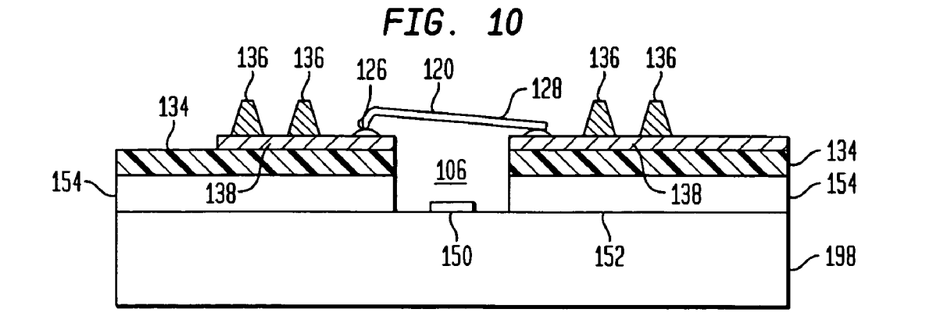
FIGS. 10 and 11 are cross-sectional views showing a process of bonding a stitch bond wire on a overlying connection component to an underlying semiconductor chip contact exposed through a bond window in accordance with an embodiment of the present invention.
Figure 11:
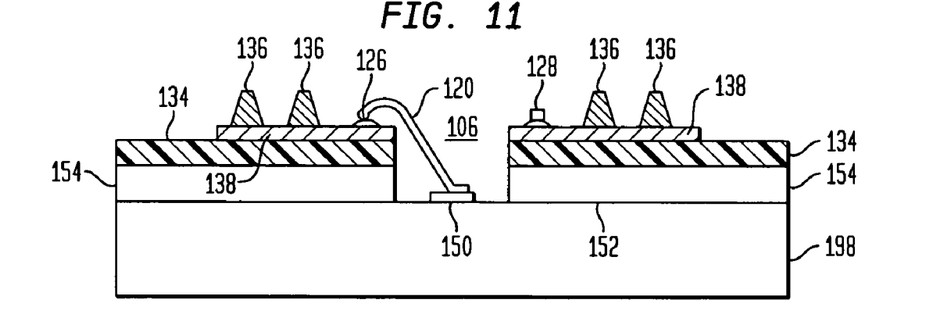
Figure 12:
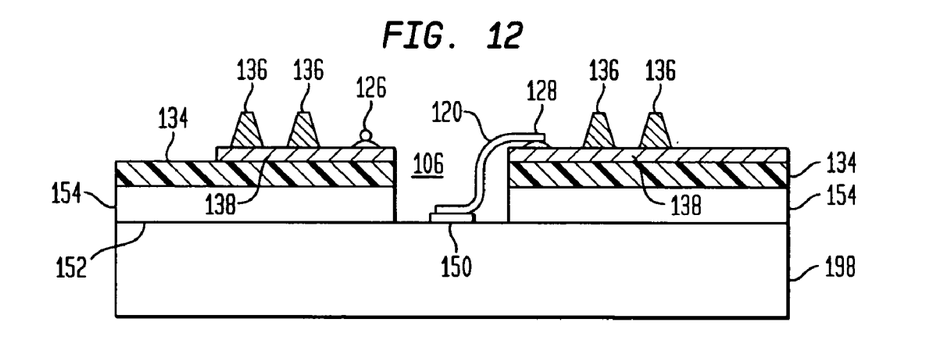
FIGS. 12 and 13 are cross-sectional views showing processes of bonding a stitch bond wire on a overlying connection component to an underlying semiconductor chip contact exposed through a bond window in accordance with other embodiments of the present invention.

Referring to FIGS. 10-12, there is disclosed an embodiment of attaching wire leads 120 of the connection component 132 to a semiconductor chip 148 having a plurality of chip contacts 150. The semiconductor chip 148 has a plurality of chip contacts 150 arranged on its upper surface 152, although only one such chip contact is illustrated. The semiconductor chip 148 is attached to the bottom surface 142 of the substrate 134 with a compliant layer disposed therebetween having an opening in alignment with gap 106 within the substrate 134. The chip contacts 150 are arranged exposed within the gap 106 generally underlying a corresponding one of the wire leads 120.

A bonding tool (not shown) engages the wire lead 120 during its descending motion towards the chip contact 150 within the gap 106. As the bonding tool approaches the chip contact 150, the wire lead 120 is severed from the stitch bond 128 on one side of the substrate 134 as shown in FIG. 11. The severed end of the wire lead 120 is then bonded to the chip contact 150. In the embodiment shown in FIG. 12, the wire lead 120 is severed at the ball bond 126 and subsequently attached to the chip contact 150. In severing the wire leads 120, the wire leads can be either broken, flanged or sheared so as to provide a detached wire lead at one end thereof which is bondable to an underlying chip contact 150. By adjusting the width of the gap 106, the height of the compliant pad 154 and the slack formed in the bonded wire leads 120, one can control the severing of the wire lead from one side or the other, i.e., at the ball bond side or stitch bond side.

Figure 13:
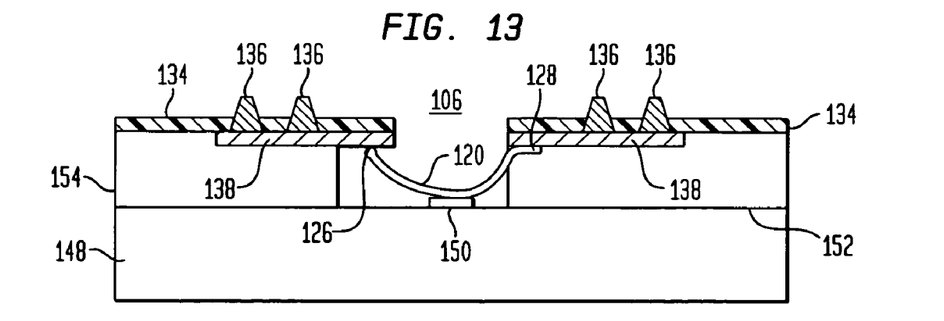

In the embodiment shown in FIG. 13, the connection component 132 as illustrated in FIG. 9 is surface bonded to a semiconductor chip 148 via a compliant layer 154. The bonding tool engages a portion of the wire lead 120 within the gap 106 so as to stretch the wire lead into a U or V-shaped profile having a portion bonded to the chip contact 150, without breaking either the ball bond 126 or stitch bond 128. The formation of sufficient slack in the wire leads 120 makes it possible for the wire leads to be bonded to the underlying chip contact 150 without any undo stress therein. The non-broken bonded wire lead 120 as shown in FIG. 13 has particular application in making a ground connection. For example, the unbroken wire lead 120 is adapted to connect two sides of a ground plane on opposite edges of the gap 106. This avoids having one of the ground planes floating.

Figure 14:
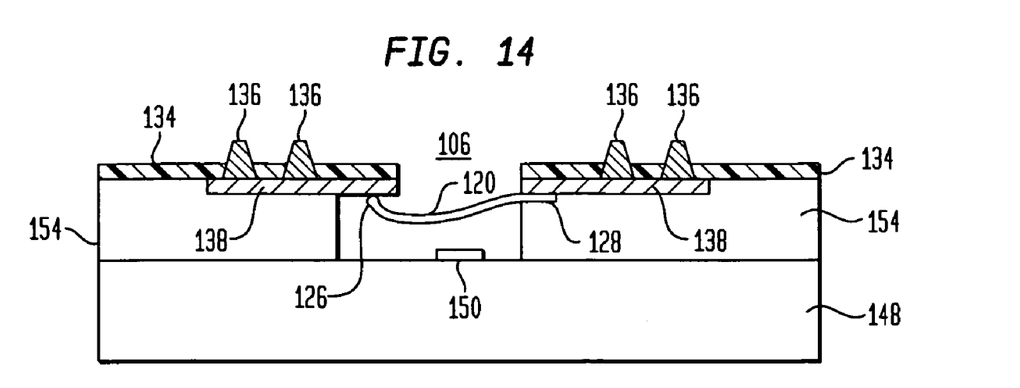
FIGS. 14 and 15 are cross-sectional views showing a process of bonding a stitch bond wire on a overlying connection component to an underlying semiconductor chip contact exposed through a bond window in accordance with another embodiment of the present invention.
Figure 15:
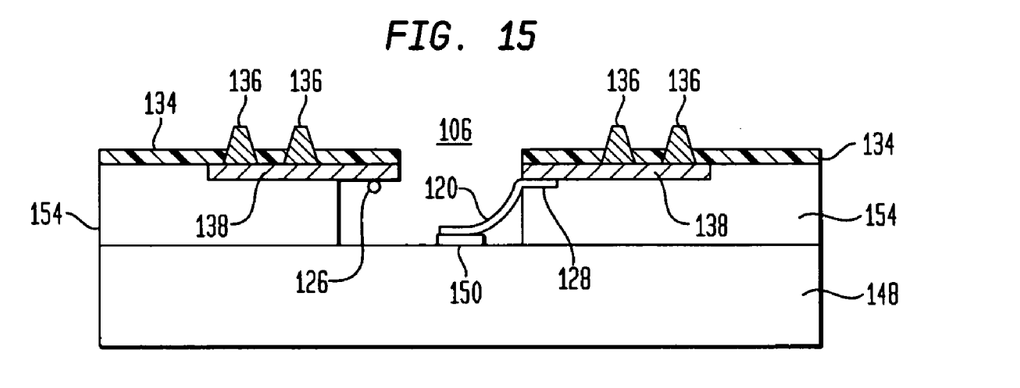

Turning to FIGS. 14 and 15, the connection component 132 is used in a circuits in structure which includes a semiconductor chip 148 having chip contacts 150 aligned within the gap 106 of substrate 134. As previously described, the semiconductor chip 148 is attached to the substrate 134 by means of a compliant layer 154. A bonding tool is used for severing the wire lead 120 at the ball bond side and attaching the severed wire lead to the underlying chip contact 150. It is also contemplated that the wire lead 120 can be severed at the stitched side for subsequent bonding to the chip contact 150.

It should be understood from the foregoing description of the present invention, that the wire leads 120 and the resulting semiconductor connection components 100, 132 are adapted to create micro BGA leads (ball grid array). As such, the present invention incorporates the use of wire leads which are ball bonded/stitch bonded across a gap in a dielectric substrate, such as a dielectric tape as known from tape automated bonding processes. The stitch bonded wire leads 120 can be created after the semiconductor chip 148 is attached to the tape substrate 102, 134 via the compliant layer 154. It is, however, preferred that the wire leads 120 be ball bonded/stitch bonded at the level of tab tape manufacturing as disclosed in the illustrated examples. Ball bonding or stitch bonding of the wire leads 120 may become more difficult due to the attenuation of ultrasonic force by the presence of the soft elastomer compliant layer 154 underlying the contacts 116, 118 or circuit traces 138. In the preferred embodiment, the wire leads 120 are stitched across the gap 106 either before or after the compliant pad 154 is attached to the substrate 102, 134, and prior to attachment of the semiconductor chip 148. It is contemplated that in the absence of the semiconductor chip 148, it would be possible to ball bond/stitch bond the wire leads 120 across the gap 106 despite the presence of the compliant layer 154 under the contacts 116, 118 or circuit traces 138 by using extreme bonding forces. The wire leads 120 can be any bondable conductive material which can be extended across the gap 106 and constrained at least at one location such as by ball bonding or stitch bonding.

The present invention has thus far been described by forming individual wire leads 120 which are ball bonded/stitch bonded to the substrate 102, 134. In another embodiment, the leads may be formed in a separate process such as by stamping, etching or plating. The created leads can then be either individually bonded such as by thermocompression or ultrasonic, or gang-bonded using any conductive adhesive media or reflowable metal to the contacts 116, 118 or circuit traces 138.

Figure 16:
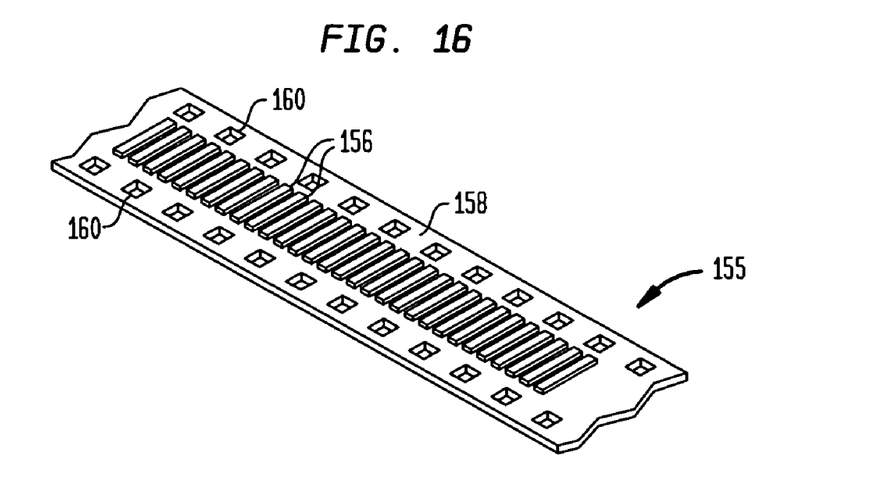
FIGS. 16 and 17 are perspective views showing prefabricated bond leads in accordance with other embodiments of the present invention.
Figure 17:
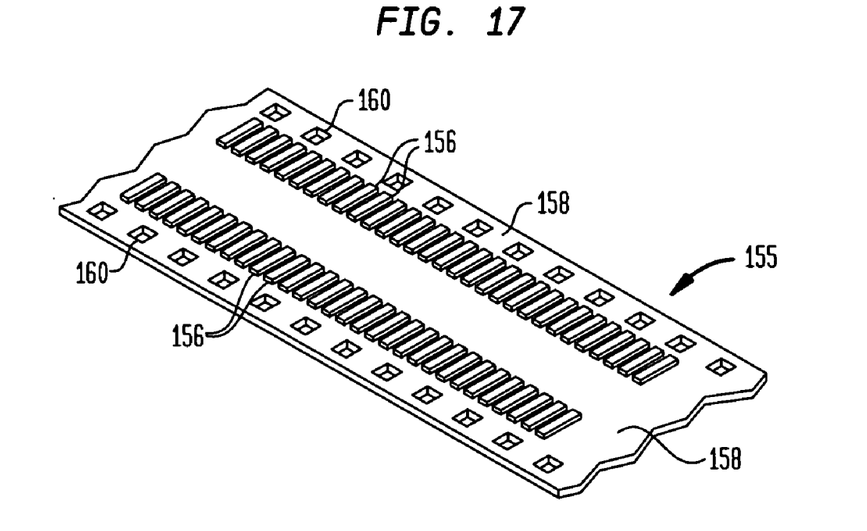
Figure 18:
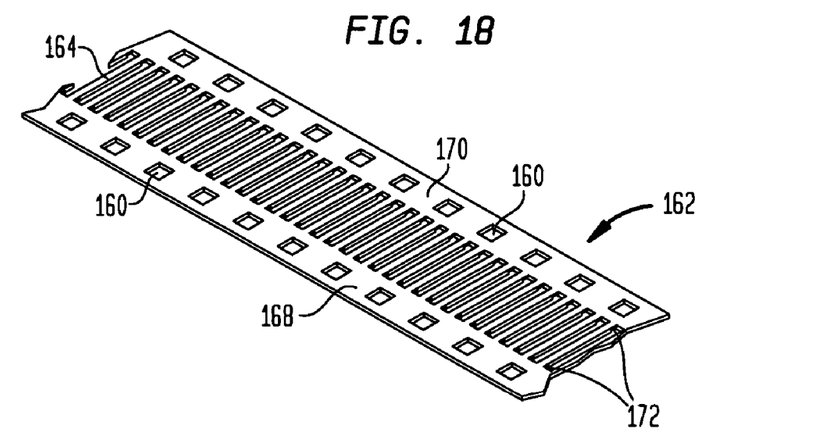
FIGS. 18 and 19 are a perspective view showing prefabricated bond leads in accordance with another embodiment of the present invention.
Figure 19:
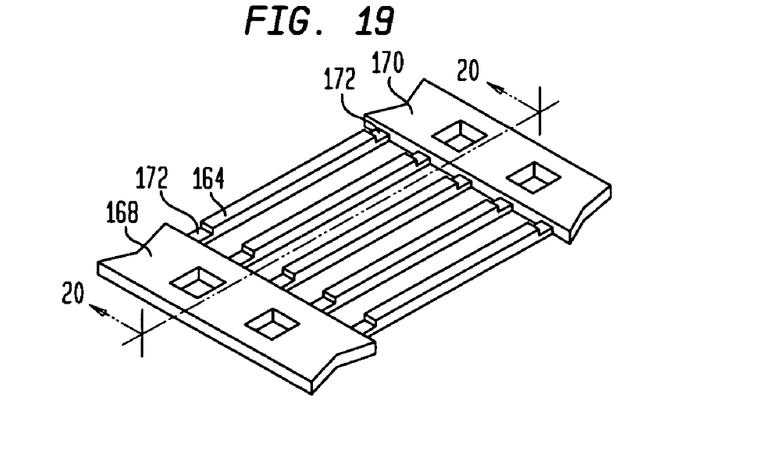
Figure 20:
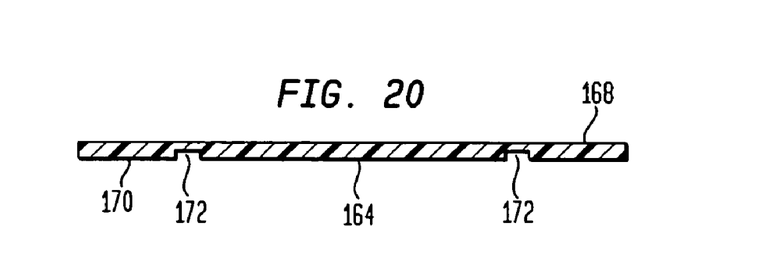
FIG. 20 is a cross-sectional view taken along line 20-21 in FIG. 19.

Referring to FIG. 16, a plurality of conductive leads 156 are formed in spaced apart relationship having their longitudinal axes arranged parallel to one another on a tape support 158 such as of dielectric material forming a lead assembly 155. In the embodiment shown in FIG. 17, a pair of spaced apart rows of leads 156 are formed on the tape support 158. The tape support 158 may be provided with a plurality of laterally arranged indexing openings 160. The leads 156 may be formed by a variety of processing techniques, for example, plating and etching as is well known in the semiconductor processing art. For example, lead forming material such as copper may be deposited onto the surface of the tape support 158. Upon masking the lead forming material using a suitable patterned photo mask, each of the leads 156 and their location on the tape support 158 can be defined. The leads 156 are formed by etching away the patterned lead forming material thereby forming the leads 156. Alternatively, the leads 156 can be formed by depositing lead forming material through a suitable patterned photo mask formed on the surface of the tape support 158. In this manner, the leads 156 can be formed from a single conductive material, or over plated with high electrically conductive and low oxidation materials such as gold and the like. The prefabricated leads 156 shown in FIGS. 16 and 17 are not required to match the pattern of contacts 116, 118 or circuit traces 138 on a tape substrates 102, 134, as a dedicated wire bonder can align and index each lead via indexing openings 160 to any position in an X-Y plane. Accordingly, the leads 156 may be arranged in other configurations than those illustrated.

Referring to FIGS. 18-21, there is shown two embodiments of a lead assembly 162 constructed in accordance with the present invention. The lead assemblies 162 include a plurality of spaced apart leads 164, 166 having their longitudinal axes arranged parallel to one other. Each of the leads 164, 166 have spaced apart ends which are integrally connected to a support in the nature of side rails 168, 170. Each of the rails 168, 170 are provided with spaced apart indexing holes 160. As previously described with respect to lead assembly 155, the lead assembly 162 is not required to have the leads 164, 166 match the pattern of contacts 116, 118 or circuit traces 138 on the tape substrates 102, 134. As such, a dedicated wire bonder can align and index the leads 164, 166 via the indexing openings 160 to any position in the X-Y plane. The lead assembly 162 and formed leads 164, 166 can be formed by any semiconductor processing technique, such as stamping from a planar metallic sheet, etching or plating. By way of example, the lead assemblies 162 can be formed by stamping a sheet of lead material using progressive tooling. Alternatively, the lead assemblies 162 can be formed by plating the leads 164, 166 and rails 168, 170 on a sacrificial support layer through a mask. Alternatively, a layer of lead-forming material can be deposited on a sacrificial support, and subsequently patterned using a photoresist mask. The leads 164, 166, rails 168, 170 and indexing openings 160 can be delineated by etching the patterned lead forming material.

Figure 21:
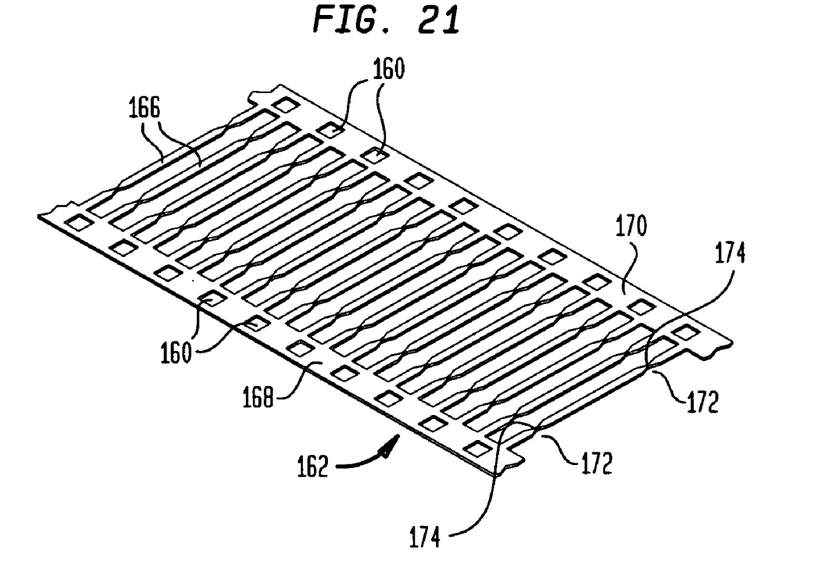
FIG. 21 is a perspective view showing prefabricated bond leads in accordance with another embodiment of the present invention.
Figure 22:
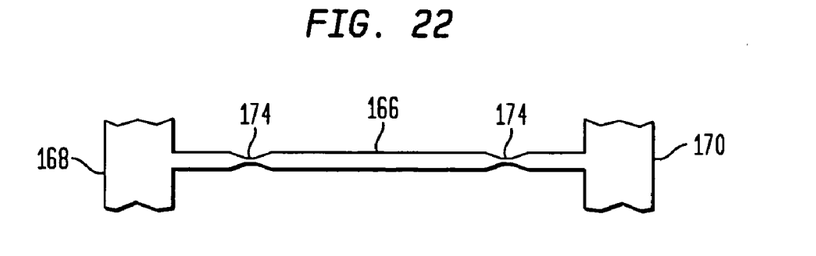
FIG. 22 is an enlarged top plan view of a portion of a bond lead as shown in FIG. 21 having frangible portions.

The leads 164, 166 can be formed at one or both of their ends adjacent rails 168, 170 with a frangible section 172. By way of example only with reference to FIGS. 18 through 19, the leads 164 are formed with frangible sections 172 in the nature of a step down of reduced thickness as best known in FIG. 20. In the lead assembly 162 as shown in FIGS. 21 and 22, the frangible section 172 is in the nature of the lead ends having reduced width or a notch 174. In either case, the frangible sections 172 enable severing of the leads 164, 166 from the rails 168, 170 during bonding. The frangible sections 172 may be formed in the leads 164, 166 using the aforementioned stamping, etching or plating processes. As such, the lead assemblies 162 and leads 164, 166 can be formed from any suitable lead material, including copper with over plating of gold or other suitable material.

In one embodiment of the present invention, the leads 164, 166 of the lead assembly 162 are aligned with the pattern of the contacts 116, 118 or circuit traces 138. This enables the leads 164, 166 to be gang bonded to the contacts 116, 118 and/or circuit traces 138 using any suitable conductive adhesive media or reflow metal provided on the contacts or circuit traces. As previously described, one end of the leads 164, 166 may be embedded into the substrate 102, 134 as opposed to bonding to a contact or circuit tracer. During the bonding process, one end of the lead 164, 166 will be bonded to one of the contacts 116, 118 or circuit trace 138. The other end of the lead 166, 168 when severed will be bonded using the bonding tool to the underlying chip contact 150. The frangible sections 172 facilitate severing of the leads 164, 166 from its associated rail 168, 170 for bonding of the severed end to the chip contacts 150.

There are numerous advantages of the leads 164, 166 being created separately, such as facilitating the bonding of the leads over the soft complaint layer 154. Micro BGA leads which have frangible notches are very yield sensitive and expensive to manufacture. Micro BGA leads also need to be electroplated to a certain thickness of gold in order to meet the reliability standards in terms of bond strength. Creating bonding leads in a separate environment, besides eliminating the necessity for electroplating gold, allows for solder attachment using thinner gold overplating. In applications such as RF modules substrates, electroplating of gold becomes difficult, but in any event, very expensive and specific. If one wants to have electroplated micro BGA leads present on those substrates, plating tie bars in RF substrates could act as stubs and create unwanted parasitic. Creating leads in separate environments can also assist structures like WAVE (wide area vertical expansion arrays).

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A connection component for a semiconductor chip, said connection component comprising:
a substrate having a gap defined between spaced apart first and second edges,
a plurality of first contacts on said substrate adjacent said first edge of said gap, and
a uniform wire lead stitched across said gap having a first end bonded to said first contact and a second end connected to said substrate adjacent said second edge of said gap;
wherein the uniform wire lead stitched across the gap of the connection component is positioned over a chip contact on said semiconductor chip;
wherein the uniform wire lead can be severed at said second end and reconnected to said chip contact.

2. The connection component of claim 1, wherein said first end of said uniform wire lead is connected to said first contact by a ball bond.

3. The connection component of claim 1, wherein said second end of said uniform wire lead is connected to said substrate adjacent said second edge of said gap by a stitch bond.

4. The connection component of claim 1, further including a second contact on said substrate adjacent said second edge of said gap, and wherein said second end of said uniform wire lead is stitch bonded to said second contact.

5. The connection component of claim 1, further including a plurality of uniform wire leads stitched across said gap having first ends connected to a plurality of first contacts adjacent said first edge and second ends connected to said substrate adjacent said second edge of said gap.

6. A method of attaching a plurality of leads to a plurality of chip contacts of a semiconductor chip, said method comprising the steps of:
providing a connection component comprising a plurality of uniform wire leads stitched across a gap defined between spaced apart first and second edges of a substrate, each uniform wire lead having a first end connected to a first contact adjacent the first edge of said gap and a second end connected to said substrate adjacent said second edge of said gap;
positioning the connection component over the semiconductor chip to expose said plurality of chip contacts through the gap;
positioning the uniform wire leads stitched across the gap of the connection component over the plurality of chip contacts of said semiconductor chip;
severing the uniform wire leads at said second ends from the substrate; and
connecting the severed leads to said plurality of chip contacts on the semiconductor chip; whereby the uniform wire leads connect the first contacts of the connection component to the chip contacts of the semiconductor chip.

7. The method according to claim 6, wherein the first ends of the uniform wire leads are connected to said first contacts by ball bonds.

8. The method according to claim 6, wherein the second end of the uniform wire leads are connected to the substrate adjacent said second edge of said gap by stitch bonds.

9. The method according to claim 6, further including a plurality of second contacts on said substrate adjacent said second edge of said gap, and wherein said second ends of said uniform wire leads are stitch bonded to the second contacts.

* * * * *